United States Patent
Choi

(10) Patent No.: US 6,821,688 B2
(45) Date of Patent: Nov. 23, 2004

(54) PHOTOMASK, METHOD FOR MANUFACTURING THE SAME AND METHOD FOR DETECTING/REPAIRING DEFECTS IN PHOTOMASK

(75) Inventor: Yo-han Choi, Yongin (KR)

(73) Assignee: Samsung Electronics Co., Ltd. (KR)

( * ) Notice: Subject to any disclaimer, the term of this patent is extended or adjusted under 35 U.S.C. 154(b) by 180 days.

(21) Appl. No.: 10/162,391

(22) Filed: Jun. 4, 2002

(65) Prior Publication Data

US 2003/0039895 A1 Feb. 27, 2003

(30) Foreign Application Priority Data

Aug. 23, 2001 (KR) .................................. 10-2001-51010

(51) Int. Cl.⁷ ................................................ G03F 9/00
(52) U.S. Cl. ........................................................ 430/5
(58) Field of Search ............................. 430/5, 311, 313, 430/314, 322, 323, 324

(56) References Cited

U.S. PATENT DOCUMENTS 5,989,754 A * 11/1999 Chen et al. ..................... 430/5
6,090,507 A *  7/2000 Grenon et al. ................. 430/5

FOREIGN PATENT DOCUMENTS

| JP | 60-222856 | 11/1907 | ............. G03F/1/00 |
| KR | 92-0017174 | 9/1992 | ........... H01L/21/00 |

* cited by examiner

*Primary Examiner*—S. Rosasco
(74) *Attorney, Agent, or Firm*—Mills & Onello, LLP

(57) ABSTRACT

A photomask includes a mask substrate formed of a transparent nonconductor, a plurality of opaque conductive patterns formed on the mask substrate and separated from one another, and one or more conductive lines for connecting one of the conductive patterns with at least one adjacent conductive patterns. Electric charges, which accumulate in conductive patterns when using a focused ion beam (FIB) system, are dispersed through the conductive lines. The contrast of images of photomask patterns is increased by dispersion of electric charges, thereby improving the images of photomask patterns.

13 Claims, 5 Drawing Sheets

POSITIONS IN WHICH CONDUCTIVE LINES ARE FORMED

US 6,821,688 B2

PHOTOMASK, METHOD FOR MANUFACTURING THE SAME AND METHOD FOR DETECTING/REPAIRING DEFECTS IN PHOTOMASK

BACKGROUND OF THE INVENTION

1. Field of the Invention

The present invention relates to a photomask, and more particularly, to a photomask that solves a problem related to charging in a focused ion beam (FIB) system, a method for manufacturing the same, and a method for detecting/repairing defects in a photomask.

2. Description of the Related Art

A photolithography process for forming microcircuits on a wafer is an important aspect of processes for manufacturing a semiconductor device. A photomask is a prototype of a circuit used in the photolithography process. Patterns formed on the photomask are transferred by radiation such as light onto a wafer through a reduction lens in the photolithography process. As a result, defects in a photomask cause defects in wafer manufacturing processes and result in defective chips. Thus, developing a technology for manufacturing a photomask without defects or for precisely detecting/repairing defects in a photomask has become important.

A scanning electron microscope (SEM) may be used to detect defects in a photomask. In a SEM, electrons with high energy are transmitted to a sample of a photomask. Since some of the incident electrons are transmitted to the sample and reflected at a boundary between the sample and an underlying layer of the sample, images of photomask patterns detected by the SEM become larger than images of a desired portion. Also, a mask substrate may be damaged by the transmission of electrons.

Thus, a focused ion beam (FIB) system, in which images of photomask patterns are obtained by detecting secondary electrons, which are generated by the collision of ions accelerated by a high voltage with the sample of a photomask, has been used as a means for detecting defects in a photomask. Further, both opaque defects and clear defects in a photomask are removed using the FIB system.

The step in which positive "+" ions (usually, positive gallium Ga+ ions) transmitted to the sample from the FIB system affect a conductive pattern of a photomask will now be described with reference to FIG. 1. In general, a substrate 10 of a photomask is formed of a transparent nonconductor such as quartz, and opaque patterns 12a, 12b, and 12c formed of conductive materials are separated from one another. Chromium (Cr) or chrome is typically used as a conductive material.

The conductive pattern 12b becomes positively charged by the Ga+ ions. However, the positive electric charges cannot be dispersed to the adjacent conductive patterns 12a and 12c because the substrate 10 is an nonconductor.

Electrons (secondary electrons) are emitted from the conductive pattern 12b when high energy GA+ ions collide with the conductive pattern 12b. The secondary electrons are combined with the transmitted GA+ ions, which means that the secondary electrons are trapped by the transmitted GA+ ions, and thus, the number of secondary electrons detected by the FIB system becomes smaller, and the contrast of images of the photomask patterns is reduced.

Furthermore, as semiconductor devices become highly integrated, the size of circuit patterns is reduced, and thus the size of the conductive patterns 12a, 12b, and 12c of the photomask becomes smaller. As a result, the GA+ ions are rapidly charged, and thus more secondary electrons are trapped.

FIG. 2 illustrates images taken by a focused ion beam (FIB) system of a photomask when a plurality of chrome (Cr) patterns are formed on a quartz substrate. The images are not clearly classified into a portion formed of chrome (Cr) and a portion formed of quartz. That is, the contrast of the images of photomask patterns is not high.

Defects in images of photomask patterns caused by the trapping of the secondary electrons are inevitable even in the FIB system. Thus, errors occur when precisely detecting defects in a photomask and removing them. Finally, defects occur in patterns on a wafer.

SUMMARY OF THE INVENTION

To solve the above problem, it is a first objective of the present invention to provide a photomask and a method of manufacturing the photomask such that images of photomask patterns having high contrast can be obtained when using a focused ion beam (FIB) system.

It is a second objective of the present invention to provide a method for precisely detecting and repairing defects in a photomask.

According to one aspect of the present invention, there is provided a photomask for a focused ion beam (FIB) system. The photomask includes a mask substrate formed of a transparent nonconductor, a plurality of opaque conductive patterns formed on the mask substrate and separated from one another, and one or more conductive lines for connecting one of the conductive patterns with at least one adjacent conductive patterns.

The charges of positive "+" ions applied to conductive patterns are dispersed through conductive lines, thus increasing the amount of secondary electrons emitted from the conductive patterns.

It is preferable that the conductive lines be formed of gallium (Ga) containing carbon (C), and the conductive lines have a thickness and a width that allows incident light to be transmitted. The conductive lines have a thickness and a width that allows incident light to be transmitted. The width of the conductive lines is less than half the wavelength of an ion source used in the FIB system, and the height of the conductive lines is less than a skin depth. The conductive patterns are formed of chromium or chrome (Cr).

According to another aspect of the present invention, there is provided a method for manufacturing a photomask. A mask substrate formed of a transparent nonconductor is prepared. A plurality of opaque conductive patterns separated from one another are formed on the mask substrate. One or more conductive lines for connecting one of the conductive patterns with at least one adjacent conductive patterns are formed on the mask substrate.

The conductive lines are formed using a FIB system, and the conductive lines are formed of gallium (Ga) containing carbon (C).

In accordance with another aspect of the invention, there is provided a method for repairing defects in a photomask. Ions emitted from a focused ion beam (FIB) system are collided with conductive patterns of the photomask including a mask substrate formed of a transparent nonconductor, a plurality of opaque conductive patterns formed on the mask substrate and separated from one another, and one or more conductive lines for connecting one of the conductive patterns with at least one adjacent conductive patterns. Electrons emitted from the conductive patterns of the photomask are detected. Images of the conductive patterns of the photomask are obtained using the detected electrons. It is determined from the images of the conductive patterns whether defects in the photomask exist. That is, it is checked whether there is a portion where chrome (Cr) is not deposited, of the conductive patterns (clear defects), and whether chrome (Cr) is formed at a portion where a quartz substrate should be exposed (opaque defects). If defects in the photomask exist, the defects in the photomask are removed by using the FIB system. The conductive lines are simultaneously removed when the defects in the photomask are opaque defects and the opaque defects are removed. On the other hand, the conductive lines are removed using a laser.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 3:
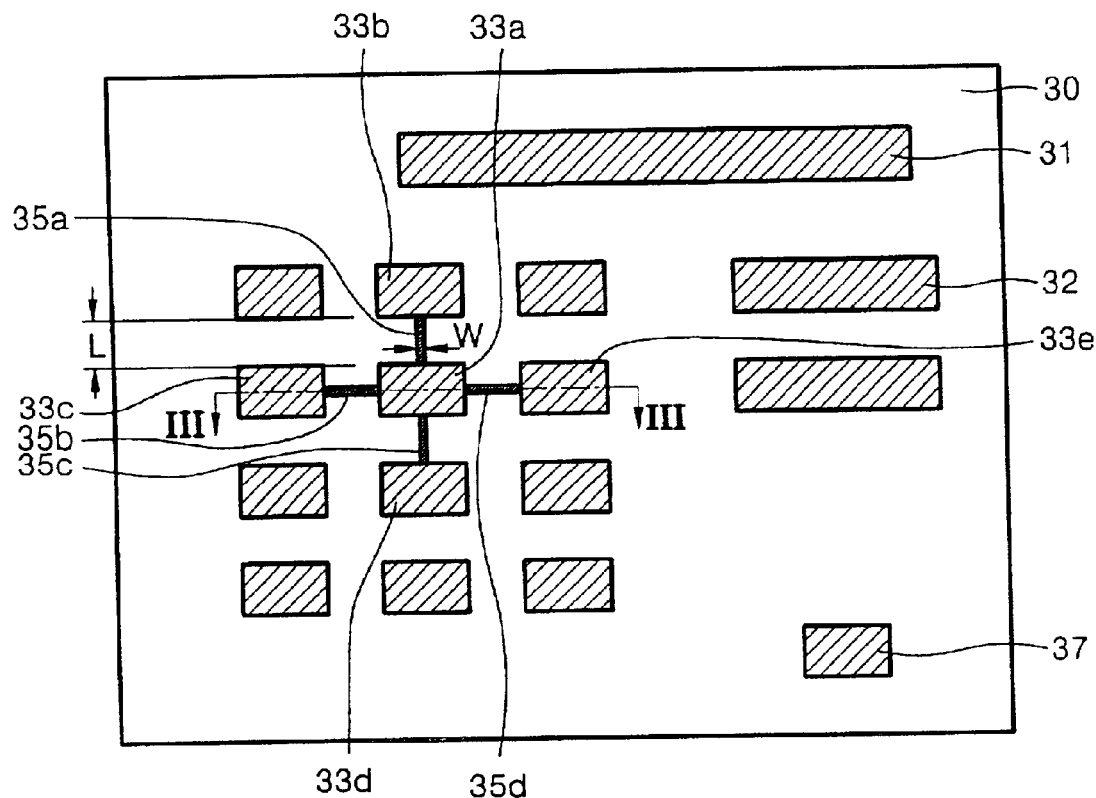
FIG. 3 is a schematic plan view of a photomask for a FIB system having a charging structure of conductive patterns, according to the present invention.

FIG. 3 is a schematic plan view of a photomask for a focused ion beam (FIB) system having a charging structure of conductive patterns, according to an embodiment of the present invention. A photomask for a FIB system means a photomask used to obtain images of photomask patterns by using a FIB system.

The photomask according to the present invention includes a mask substrate 30 formed of a transparent nonconductor, conductive patterns 31, 32, 33a–33e, and 37 formed on the mask substrate 30, and conductive lines 35a–35d. Preferably, the mask substrate 30 is formed of a material having a small thermal expansion coefficient, and thus quartz is used here as the mask substrate 30. The conductive patterns 31, 32, 33a–33e, and 37 are formed of chromium or chrome (Cr) when the photomask is a chromium or chrome binary mask, and a phase shift layer (not shown) can be interposed between conductive patterns and a quartz substrate when the photomask is a phase shifting mask (PSM). The size and arrangement of conductive patterns can be different in accordance with the kind and size of circuit devices.

For convenience, FIG. 3 illustrates the conductive patterns 33a–33e, which are regularly arranged, and the conductive lines 35a–35d, which connect the conductive patterns 33a–33e. The conductive lines 35a–35d may be an opaque layer and have a narrower width W and lower height H than the conductive patterns 33a–33e. Thus the conductive patterns 33a–33e and the conductive lines 35a–35d can be distinct. When opaque conductive lines are formed, they are removed after detecting and repairing defects.

Preferably, the conductive lines 35a–35d are formed of a transparent layer. Usually, light (or electromagnetic waves) cannot be transmitted through a metal layer. However, if the thickness of the metal layer is less than a skin depth, light can be transmitted through the metal layer. Skin depth depends on the frequency of light transmitted and on the magnetic permeability and conductivity of the metal layer. Further, it is well-known that light can be transmitted through the metal layer when the width of the metal layer is less than half the wavelength of light. Thus, if the width W of the conductive lines 35a–35d is designed to be less than half the wavelength of incident light and the thickness H of the conductive lines 35a–35d is designed to be less than the skin depth, light can be transmitted through the conductive lines 35a–35d. The conductive lines 35a–35d satisfying the above-mentioned conditions can be formed using the FIB system. This is the reason the thickness and the permeability of a conductive material layer can be precisely controlled in accordance with dose of ions used in the deposition of conductive materials in the FIB system.

Figure 4:
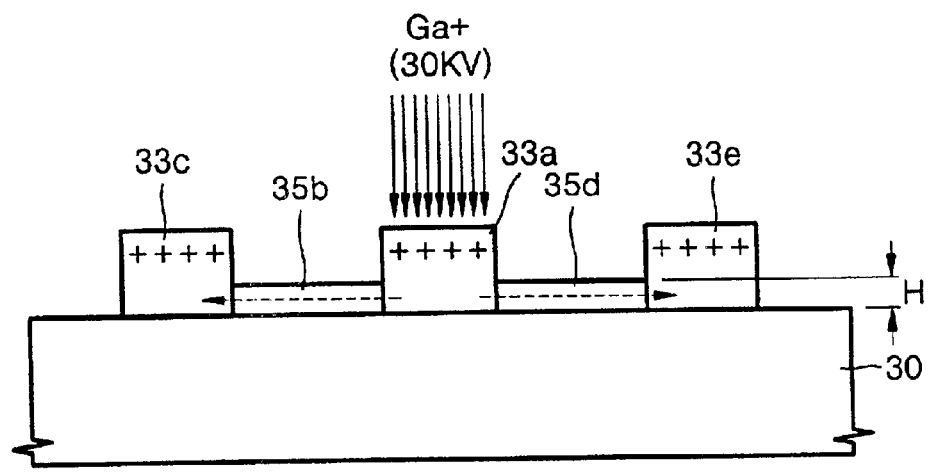
FIG. 4 is a schematic sectional view taken along line III—III of FIG. 3 which illustrates charging of conductive patterns of a photomask according to the present invention.

Dispersion of charges through conductive lines will be described with reference to FIG. 4, a sectional view taken along line III—III of FIG. 3.

Ions having a predetermined energy emitted from an ion source pass through an optical system (not shown), and the surface of the conductive pattern 33a formed on the mask substrate 30 is bombarded by ions. The ions emitted from the ion source are positive gallium GA+ ions with about 30 KV. The conductive pattern 33a becomes positively charged due to the GA+ ions. However, the conductive pattern 33a is connected to neighboring conductive patterns 33c and 33e through the conductive lines 35b and 35d. Thus, the GA+ ions are dispersed into the conductive patterns 33c and 33e through the conductive lines 35b and 35d. Thus, an electrical attractive force between GA+ ions and secondary electrons, which traps electrons (secondary electrons) generated from the conductive pattern 33a by the collision of GA+ ions with the conductive pattern 33a is reduced. Thus, as the amount of the secondary electrons detected by the FIB system increases, the contrast of the conductive pattern 33a is increased, thereby improving the distinctiveness of image of the conductive pattern 33a.

Figure 1:
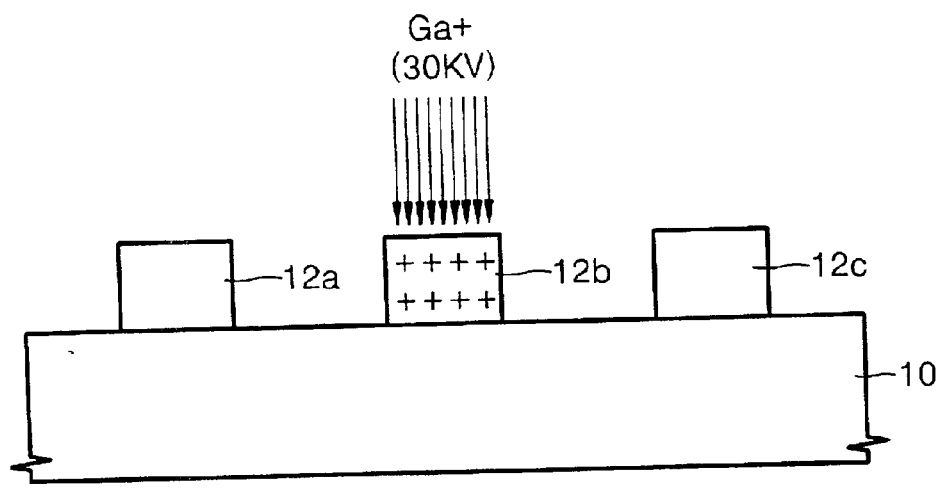
FIG. 1 is a schematic sectional view which illustrates charging of conductive patterns of a photomask in the case of using a focused ion beam (FIB) system.
Figure 2:
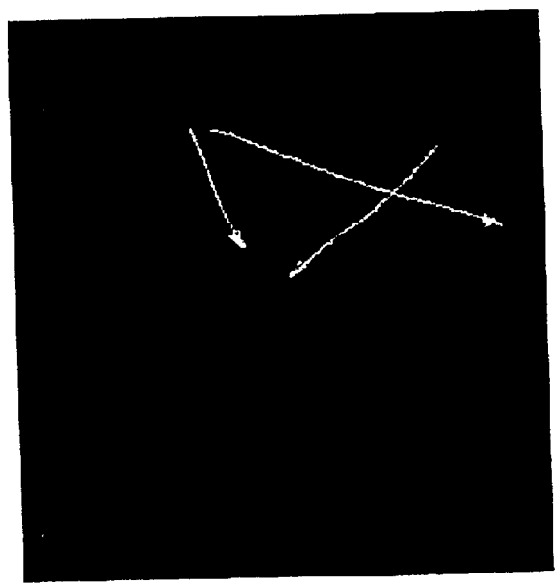
FIG. 2 illustrates images taken by a focused ion beam (FIB) system of the photomask having a charging structure of FIG. 1.
Figure 5:
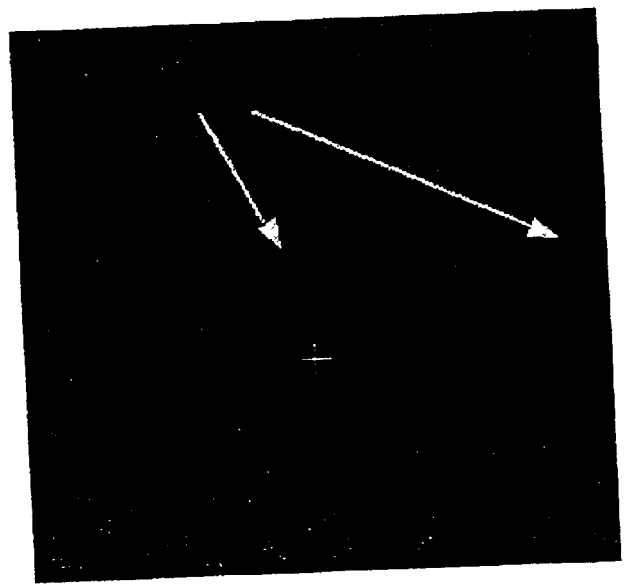
FIG. 5 illustrates images taken by a focused ion beam (FIB) system of the photomask having the charging structure, according to the present invention.

Increase in the contrast of the conductive patterns owing to the conductive lines is shown in FIG. 5. FIG. 5 is analogous to FIG. 2, and a photographed object of FIG. 5 is a photomask substrate on which conductive lines are formed between the conductive patterns formed of chrome (Cr).

Figure 6A:
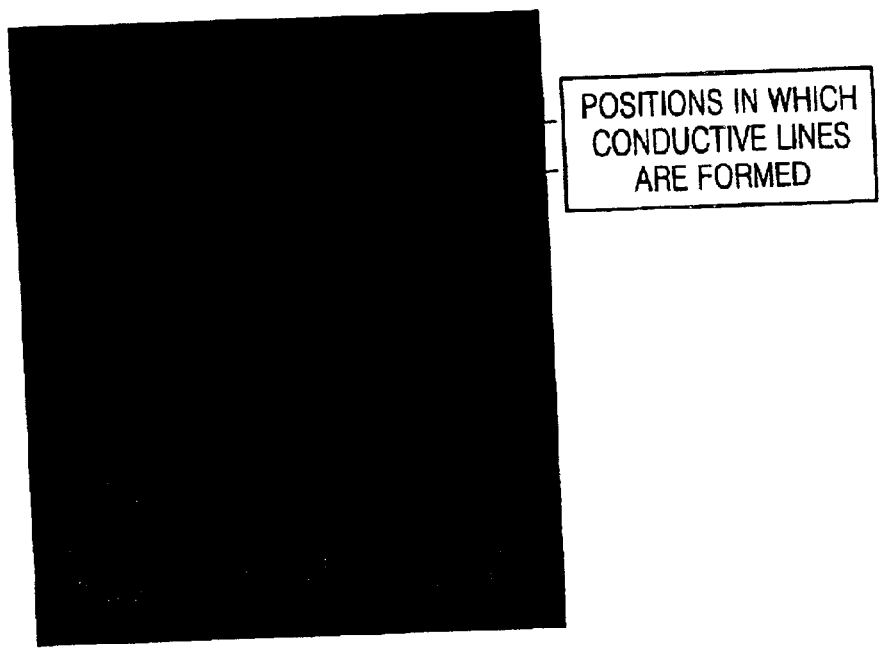
FIG. 6A illustrates images taken by an aerial image measurement system (AIMS) when the photomask having the charging structure according to the present invention is exposed onto a wafer.
Figure 6B:
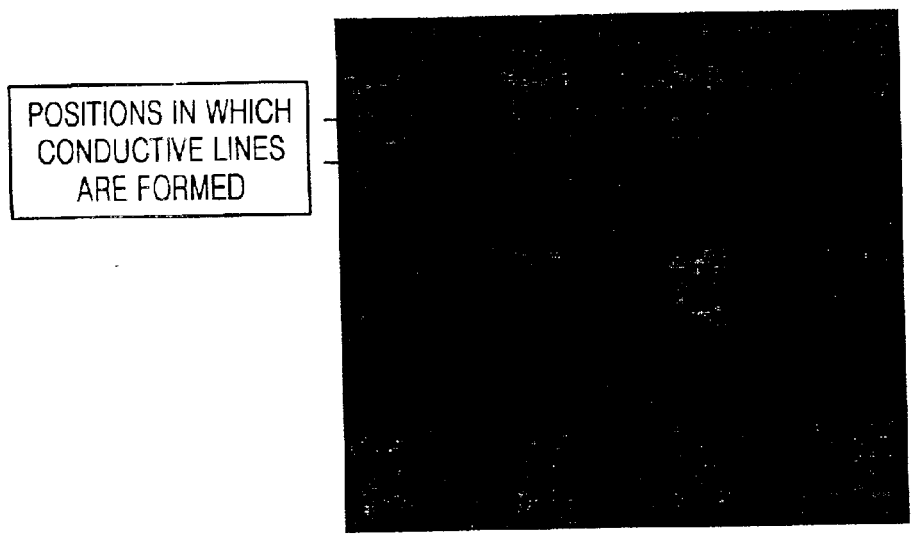
FIG. 6B illustrates images taken by a scanning electron microscope (SEM) when the photomask having the charging structure according to the present invention is exposed onto a wafer.

FIGS. 6A and 6B are images illustrating whether conductive lines besides conductive patterns are transferred onto a wafer when photomask patterns including conductive lines satisfying predetermined conditions are transferred onto the wafer. FIG. 6A illustrates images taken by an aerial image measurement system (AIMS) as a simulation tool for previewing images formed when conductive patterns on a photomask are transferred onto the wafer, and FIG. 6B illustrates images taken by a scanning electron microscope (SEM). Both FIG. 6A and FIG. 6B are images of a photomask including conductive lines and conductive patterns. As mentioned above, the predetermined conditions mean that the thickness of conductive lines must be less than the skin depth, or the width of conductive lines must be less than half the wavelength of a light source. Conductive lines are shown in FIG. 6B, but not shown in FIG. 6A, and only the transfer of conductive patterns is shown in FIG. 6A.

Figure 7A:
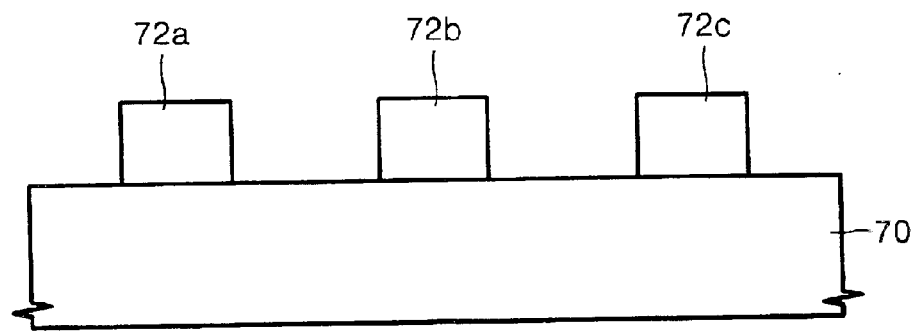
FIGS. 7A and 7B are schematic sectional views which illustrate steps of manufacturing the photomask according to the present invention.

In order to manufacture the above-described photomask, an opaque conductive material such as chrome (Cr), is coated onto the entire surface of a mask substrate 70 formed of a transparent nonconductor, such as quartz. The conductive material is patterned, as shown in FIG. 7A, to form conductive patterns 72a, 72b, and 72c.

Figure 7B:
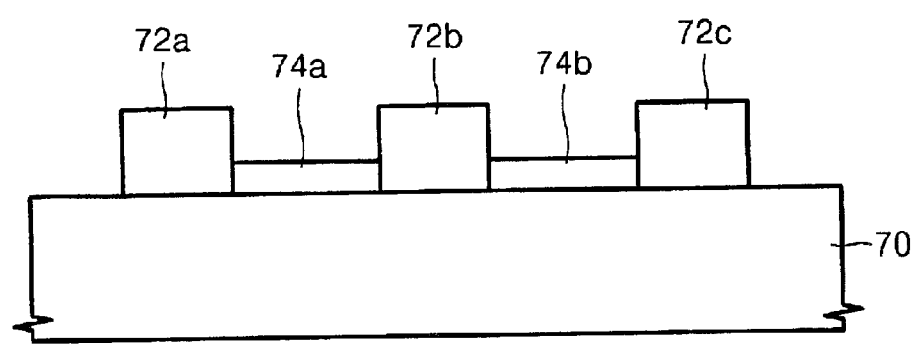

Next, as shown in FIG. 7B, conductive lines 74a and 74b having a thickness less than that of the conductive patterns 72a, 72b, and 72c having a predetermined width are formed on the exposed mask substrate 70 between the conductive patterns 72a, 72b, and 72c. Preferably, the conductive lines 74a and 74b are formed using the FIB system. In such a case, the conductive lines 74a and 74b can be formed of gallium (Ga) containing carbon (C).

Figure 8:
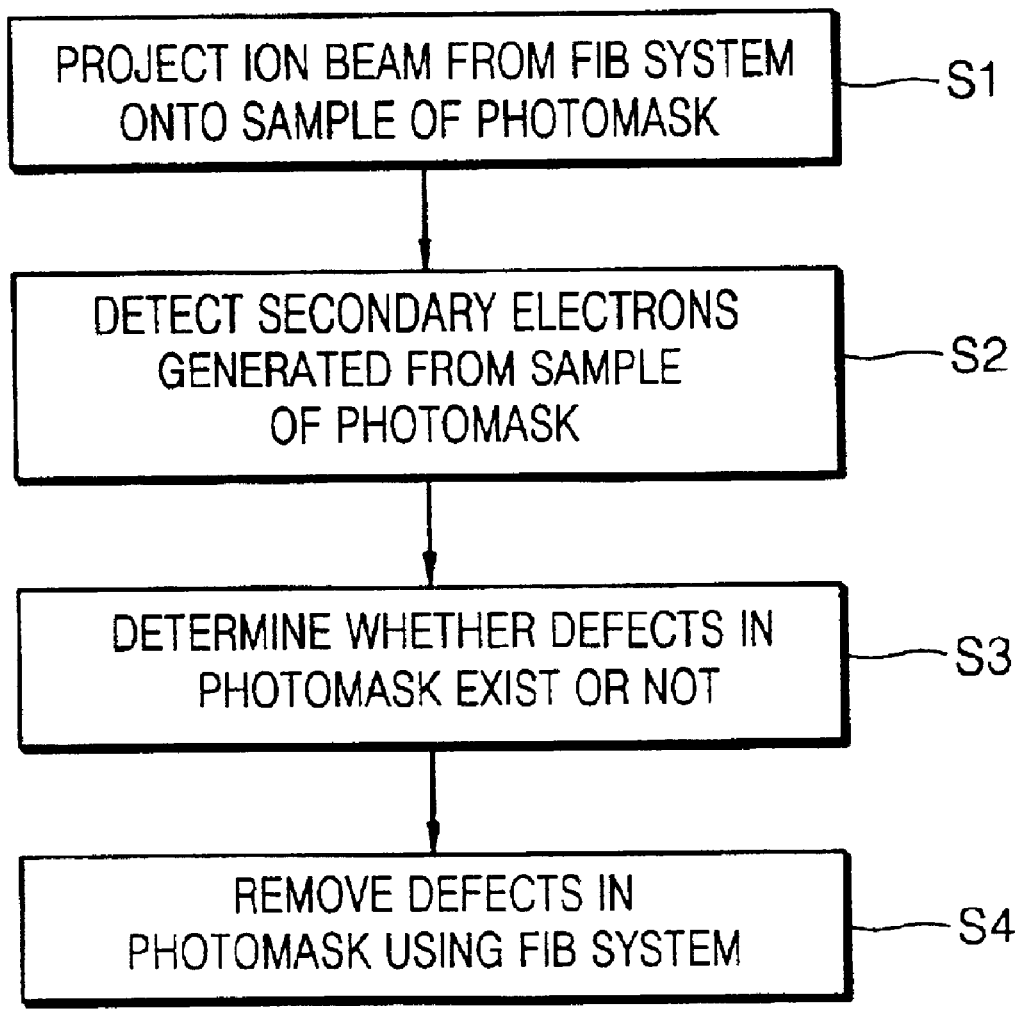
FIG. 8 is a flowchart illustrating steps of detecting defects in the photomask and repairing the defects using the FIB system according to the present invention.

The contrast of the conductive patterns is increased, and thus its image is improved. As a result, defects in a photomask can be easily and precisely detected, and the defects can be removed. Specifically, as shown in FIG. 8, in step S1, an ion beam is projected from the FIB system onto a sample of a photomask according to the present invention, that is, onto one of a plurality of conductive patterns connected by conductive lines. In step S2, the ion beam collides with the conductive patterns, and thus secondary electrons are generated and detected by the FIB system. An end point of the conductive patterns is recognized to output images of the photomask. In step S3, it is determined from the images of the photomask whether defects in the photomask exist. Defects in the photomask can include opaque defects and clear defects. Opaque defects occur when chrome (Cr) is formed at a portion where there should not be an opaque conductive material such as chrome (Cr), and the clear defects occur when chrome (Cr) is not formed at a portion where there should be chrome (Cr).

Next, in step S4, according to the type of defects, the method for repairing defects are different. For example, opaque defects such as undesired chrome (Cr), are removed by performing ion milling, and clear defects are repaired by forming a conductive layer of carbon (C) and gallium (Ga). When repairing the defects, the conductive lines can be simultaneously removed, or the conductive lines can be removed in an additional step after the defects are repaired. The conductive lines can be also removed using laser.

However, if the conductive lines perform dispersion of electric charges and have a thin thickness, a narrow width, or transmission enough to transmit light, the conductive lines are not transferred onto the wafer, and thus it need not be removed.

The photomask for a FIB system according to the present invention includes the mask substrate formed of a transparent nonconductor, the opaque conductive patterns formed on the mask substrate, and transparent or opaque conductive lines for connecting the neighboring conductive patterns, thereby dispersing charges of an ion beam transmitted from the FIB system and increasing the amount of the secondary electrons emitted from the conductive patterns. Thus, the contrast of the photomask can be increased, image distinctiveness can be improved, and further, the defects in the photomask can be precisely detected.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A photomask for a focused ion beam (FIB) system, the photomask comprising:
    a mask substrate formed of a transparent nonconductor;
    a plurality of opaque conductive patterns formed on the mask substrate and separated from one another; and
    one or more conductive lines for connecting one of the conductive patterns with at least one adjacent conductive pattern, wherein the conductive lines have a thickness and a width that allow incident light to be transmitted, the width being less than half the wavelength of an ion source used in the FIB system, a thickness of the conductive lines being less than a skin depth.

2. The photomask as claimed in claim 1, wherein the conductive lines are formed of gallium (Ga) containing carbon (C).

3. The photomask as claimed in claim 1, wherein the mask substrate comprises quartz.

4. The photomask as claimed in claim 1, wherein the conductive patterns comprise chromium (Cr).

5. A method for manufacturing a photomask, the method comprising the steps of:
    preparing a mask substrate formed of a transparent nonconductor;
    forming a plurality of opaque conductive patterns separated from one another on the mask substrate; and
    forming one or more conductive lines on the mask substrate for connecting one of the conductive patterns with at least one adjacent conductive pattern, wherein the conductive lines have a thickness and a width that allow incident light to be transmitted, the width being less than half the wavelength of an ion source used in the FIB system, a thickness of the conductive lines being less than a skin depth.

6. The method as claimed in claim 5, wherein the conductive lines are formed of gallium (Ga) containing carbon (C).

7. The method as claimed in claim 6, wherein the conductive lines are formed of at least one transparent material.

8. The method as claimed in claim 5, wherein the mask substrate comprises quartz.

9. The method as claimed in claim 5, wherein the conductive patterns comprise chromium (Cr).

10. A method for repairing defects in a photomask, the method comprising the steps of:
    colliding ions emitted from a focused ion beam (FIB) system with conductive patterns of the photomask, the photomask including a mask substrate formed of a transparent nonconductor, a plurality of opaque conductive patterns being formed on the mask substrate and separated from one another, and one or more conductive lines for connecting one of the conductive patterns with at least one adjacent conductive pattern, wherein the conductive lines have a thickness and a width that allow incident light to be transmitted, the width being less than half the wavelength of an ion source used in the FIB system, a thickness of the conductive lines being less than a skin depth;

detecting electrons emitted from the conductive patterns of the photomask;

obtaining images of the conductive patterns of the photomask using the detected electrons; and determining from the images of the conductive patterns whether defects in the photomask exist; and removing the defects in the photomask by using the FIB system.

11. The method as claimed in claim 10, wherein the defects in the photomask are at least one of clear defects and opaque defects.

12. The method as claimed in claim 10, wherein, if the defects in the photomask are opaque defects, the conductive lines are simultaneously removed when the opaque defects are removed.

13. The method as claimed in claim 10, wherein the conductive lines are removed using a laser.

* * * * *